United States Patent [19]
Chang et al.

[11] Patent Number: 6,127,958
[45] Date of Patent: Oct. 3, 2000

[54] ANALOG/DIGITAL CONVERTING CIRCUIT

[75] Inventors: Dong-Young Chang; Jae-Yup Lee; Seung-Hoon Lee; Yong-In Park, all of Seoul; Seung Woo Park, Cheongju, all of Rep. of Korea

[73] Assignee: Hyundai Electronics Industries Co., Ltd., Ichon, Rep. of Korea

[21] Appl. No.: 09/150,906

[22] Filed: Sep. 10, 1998

[30] Foreign Application Priority Data

Sep. 11, 1997 [KR] Rep. of Korea ................. 97-46670

[51] Int. Cl.$^7$ .................. H03M 1/12; H03M 1/00
[52] U.S. Cl. .................... 341/155; 341/122
[58] Field of Search ............................ 341/155

[56] References Cited

U.S. PATENT DOCUMENTS

| | | | |
|---|---|---|---|
| 4,894,656 | 1/1990 | Hwang et al. | 341/155 |
| 5,710,563 | 1/1998 | Vu et al. | 341/155 |

*Primary Examiner*—Trong Phan
*Attorney, Agent, or Firm*—Fleshner & Kim, LLP

[57] ABSTRACT

An analog/digital (A/D) converting circuit is provided that stabilizes system operation, reduces power consumption in an analog circuit region and uses a selected metal-to-metal capacitor, which has a small parasitic capacitance value. The A/D converting circuit includes a first sample/hold amplifier for sampling/holding an analog input signal, a switch for selecting one of a signal outputted from the first sample/hold amplifier and a feedback signal and an A/D sub-converter for converting an analog signal outputted from the switch to a digital signal. A multiplying D/A converting block converts an output signal from the A/D sub-converter to an analog signal and amplifies a difference value obtained between the analog signal and the analog signal outputted from the switch. A second sample/hold amplifier samples/holds a signal outputted from the multiplying D/A converting block and outputs the feedback signal to the switch. A digital correcting unit outputs an N bit digital signal by superimposing output signals from the A/D sub-converter by 1 bit and a timing controller generates a control signal and a timing clock signal for the operation of each unit.

18 Claims, 5 Drawing Sheets

ANALOG/DIGITAL CONVERTING CIRCUIT

BACKGROUND OF THE INVENTION

1. Field of the Invention

The present invention relates to an analog/digital (A/D) converting technique, and more particularly to an A/D converting circuit capable of minimizing a characteristic change of a cell array.

2. Description of the Conventional Art

Generally, an algorithmic A/D converter, a successive-approximation-register type A/D converter and a Σ-Δ A/D converter are used in audio applications. Among those converters, the algorithmic A/D converter most effectively controls power consumption, clock speed, a number of devices thereof, etc. In particular, the algorithmic A/D converter, which is also called a cyclic or recirculating A/D converter, can be enlarged to a pipelined construction for a video signal process with slight modification of the A/D circuit block portion.

FIG. 1 is a block diagram showing a related art A/D converter. As shown in FIG. 1, the related art algorithmic A/D converter includes a switch 101 for selecting an input signal Vi or feedback signal Vf, a sample/hold amplifier 102 for sampling/holding a signal from the switch 101, and an A/D sub-converter 105 for converting an output signal from the sample/hold amplifier 102 to a digital signal. A D/A sub-converter 106 converts a signal outputted from the A/D sub-converter 105 to an analog signal and a subtracter 103 obtains a difference value by comparing signals outputted from each of the sample/hold amplifier 102 and the D/A sub-converter 106. A remain voltage amplifier 104 amplifies a signal outputted from the subtracter 103 at a predetermined level. A digital correcting unit 107 corrects an error of the output signal from the A/D sub-converter 105 by superimposing each single bit thereof and outputs an N bit digital signal that is corrected.

The operation of the related art A/D converter will now be described. First, when the switch 101 is connected to a channel 1 and an external analog signal Vi is inputted, the sample/hold amplifier 102 samples/holds the analog signal Vi. At this time, the n bit A/D sub-converter 105 converts the signal outputted from the sample/hold amplifier 102 to a digital signal, and the n bit D/A sub-converter 106 converts the digital signal from the A/D sub-converter 105 to an analog signal. The subtracter 103 generates a remain voltage, that is, a difference value between a signal from the sample/hold amplifier 102 and a signal from the D/A sub-converter 106, and the remain voltage amplifier 104 amplifies the remain voltage.

Then, the switch 101 is switched to channel 2 to connect an output terminal of the remaining voltage amplifier 104 to an input terminal of the sample/hold amplifier 102. Thus, the sample/hold amplifier 102 samples/holds a signal from the remain voltage amplifier 104.

Therefore, when the n bit A/D sub-converter 105 converts an error being held in the sample/hold amplifier 102 to a digital signal, the D/A sub-converter 106 converts the digital signal to an analog signal, and outputs the analog signal to the subtracter 103. The subtracter 103 subtracts the output signal from the A/D sub-converter 106 from an output signal from the sample/hold amplifier 102 and feeds back a resultant value to the sample/hold amplifier 102 via the remain voltage amplifier 104.

In the above-described operation, an n bit output signal is determined in each data conversion cycle, and the above operation is repeated until the digital correcting unit 107 outputs the N bit digital signal. The digital correcting unit 107 eliminates an offset or feedthrough error in the sample/hold amplifier 102, the A/D converter 105, and the D/A converter 106 by superimposing each data having n bits by 1 bit to output normal digital data.

However, the related art analog/digital converting circuit has various disadvantages. When a poly is not provided to a capacitance applied to the related art A/D converter circuit in a standard digital CMOS process such as a poly-poly or poly-diffusion, a new process is needed and should be applied. Further, in the related art, there is no method of minimizing power consumed in an analog circuit provided with an operational amplifier, etc. In addition, when a capacitance applied to the analog circuit significantly changes, the circuit operation becomes unstable.

The above references are incorporated by reference herein where appropriate for appropriate teachings of additional or alternative details, features and/or technical background.

SUMMARY OF THE INVENTION

An object of the present invention is to provide an A/D converting circuit that substantially obviates one or more of the problems and disadvantages caused by the related art.

Another object of the present invention is to provide an A/D converting circuit including a metal-to-metal capacitor having a reduced or minimum parasitic capacitance value and a capacitor tuning circuit to prevent the capacitor from being deteriorated with respect to a capacitance change.

Another object of the present invention is to provide an A/D converting circuit that reduces or minimizes power consumption by minimizing power consumption in an analog data region.

Another object of the present invention is to provide an A/D converting circuit that stabilizes operations of an analog data region of an A/D converting circuit.

Another object of the present invention is to provide an A/D convertor that reduces or minimizes a characteristic change of a standard cell library formed by a digital CMOS process.

Another object of the present invention is to provide A/D converting circuit that prevents a change of thickness between metals with respect to a change of the capacitance value by using a metal-to-metal capacitor that has a selected or smallest parasitic capacitance value.

Another object of the present invention is to provide an A/D converting circuit that uses a capacitor tuning circuit to select a reduced or minimum power capacitor among a plurality of metal-to-metal capacitors to reduce or minimize power consumption of an operational amplifier.

To achieve at least the above objects in a whole or in parts, there is provided an A/D converting circuit that includes a first sample/hold amplifier that samples/holds an analog input signal, a switch that selects one of an analog output signal from the first sample/hold amplifier and an analog feedback signal, an A/D sub-converter that converts an analog output signal from the switch to a digital signal, a digital/analog (D/A) sub-converter that converts the digital signal from the A/D sub-converter to a converted analog signal, a subtracter that generates a difference value between the analog output signal from the switch and the converted analog signal, a voltage amplifier that amplifies the difference value from the subtracter, a second sample/hold amplifier that samples/holds an output signal from the voltage amplifier and outputs the feedback signal to the switch and a digital correcting unit coupled to the A/D sub-converter that outputs an N bit digital signal in a plurality of cycles.

To further achieve at least the above objects in a whole or in parts, there is provided a circuit for converting a first type input signal that includes a first amplifier that receives the first type input signal, a switch that selects one of an output signal from the first amplifier and a feedback signal, a sub-converter that converts an output signal from the switch to a signal of a second type, a converting block that converts the output signal from the sub-converter to a first signal of the first type and amplifies a difference in value between the first signal and one of the first type input signal and the feedback signal, a second amplifier that receives an output signal from the converting block and outputs the feedback signal to the switch and a correcting unit coupled to the sub-converter that outputs the second type signal.

To further achieve at least the above objects in a whole or in parts, there is provided an amplifying circuit for use in an analog to digital converting circuit that includes first and second amplifiers coupled in series between an input node and an output node, a bias circuit to the first and second amplifiers and a tuning circuit coupled to an input terminal and an output terminal of the second amplifier.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
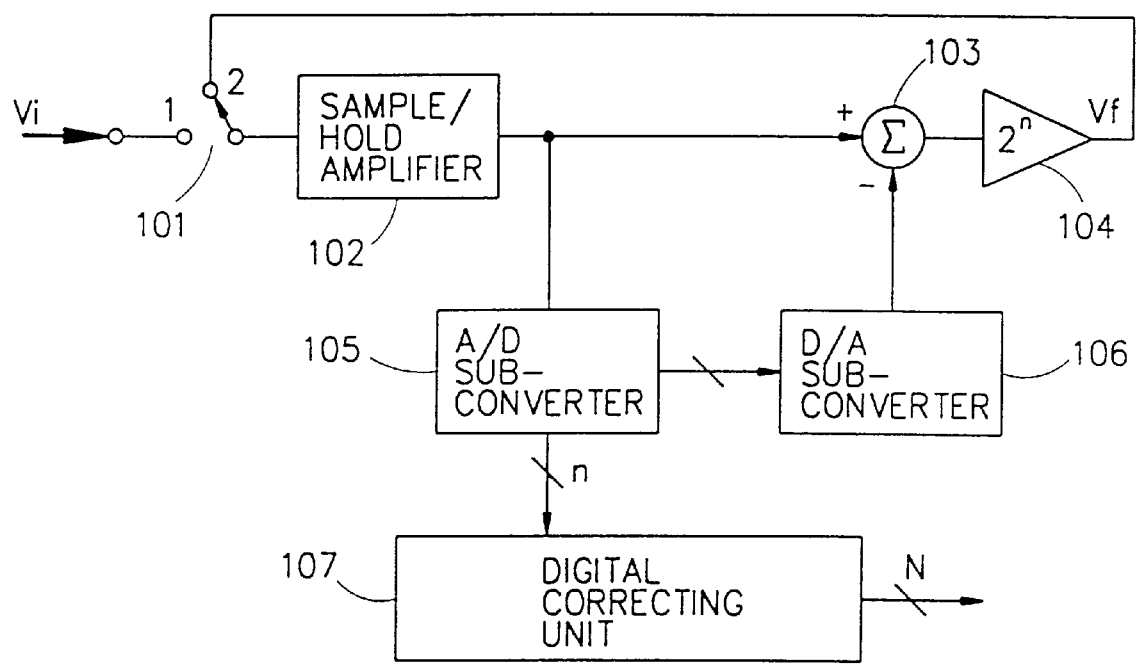
FIG. 1 is a block diagram showing a related art A/D converting circuit.
Figure 2:
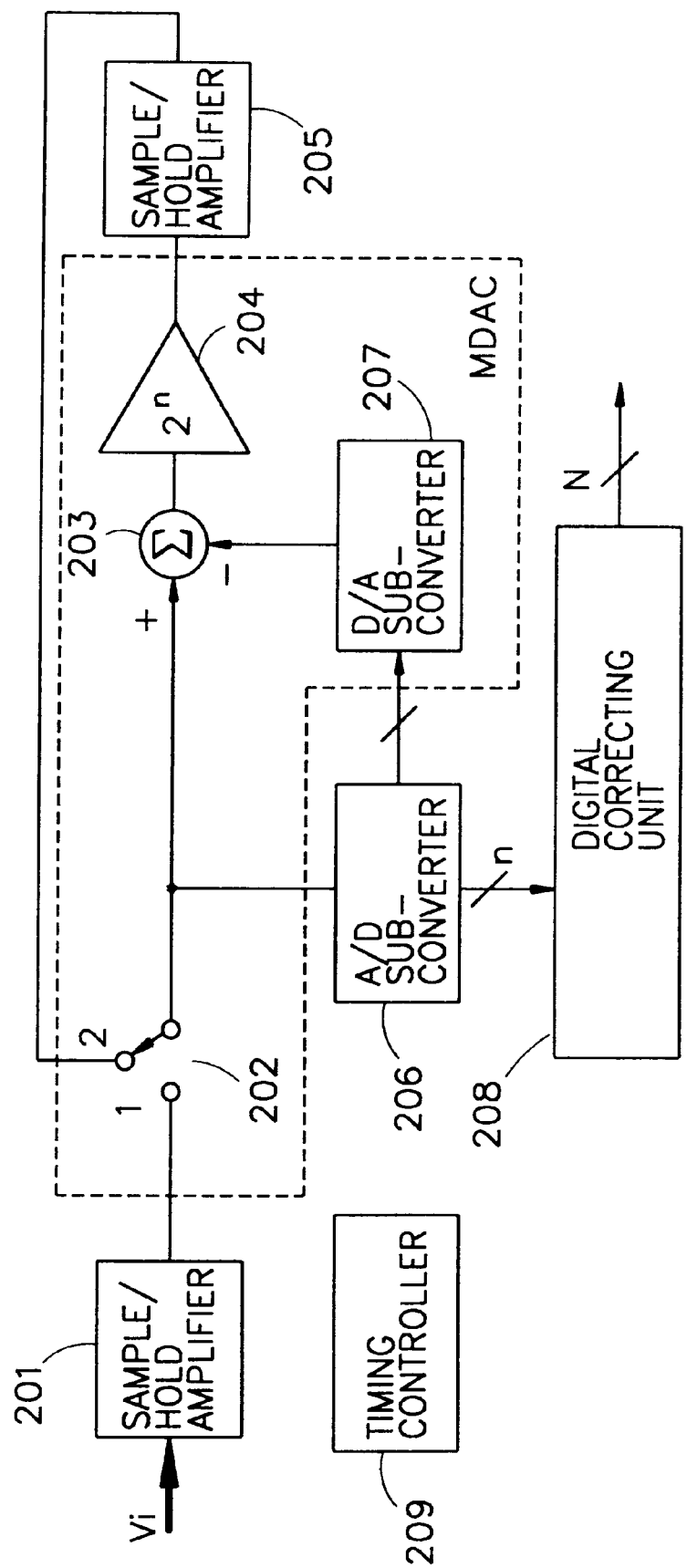
FIG. 2 is a block diagram showing a preferred embodiment of an A/D converting circuit according to the present invention.

FIG. 2 is a block diagram showing a preferred embodiment of the A/D converting circuit according to the present invention. As shown in FIG. 2, the preferred embodiment of the A/D converting circuit includes a first sample/hold amplifier 201 for holding/sampling an analog input signal Vi, a switch 202 for selecting one of a feedback signal Vf and an output signal from the first sample/hold amplifier 201 and an A/D converter 206 for converting an analog signal that is inputted via the switch 202 to a digital signal. A D/A converter 207 converts an output signal from the A/D converter 206 to an analog signal, and a subtracter 203 generates a difference value of the analog signal inputted via the switch 202 and an output signal from the D/A converter 207. A remain voltage amplifier 204 amplifies an output signal from the subtracter 203. A second sample/hold amplifier 205 samples/holds an output signal from the remain voltage amplifier 204 and feeds back a resultant signal to the switch 202. A digital correcting unit 208 outputs an N bit digital signal by superimposing signals outputted from the A/D sub-converter 206 by 1 bit, and a timing controller 209 generates a timing clock signal for operating each unit.

Figure 3:
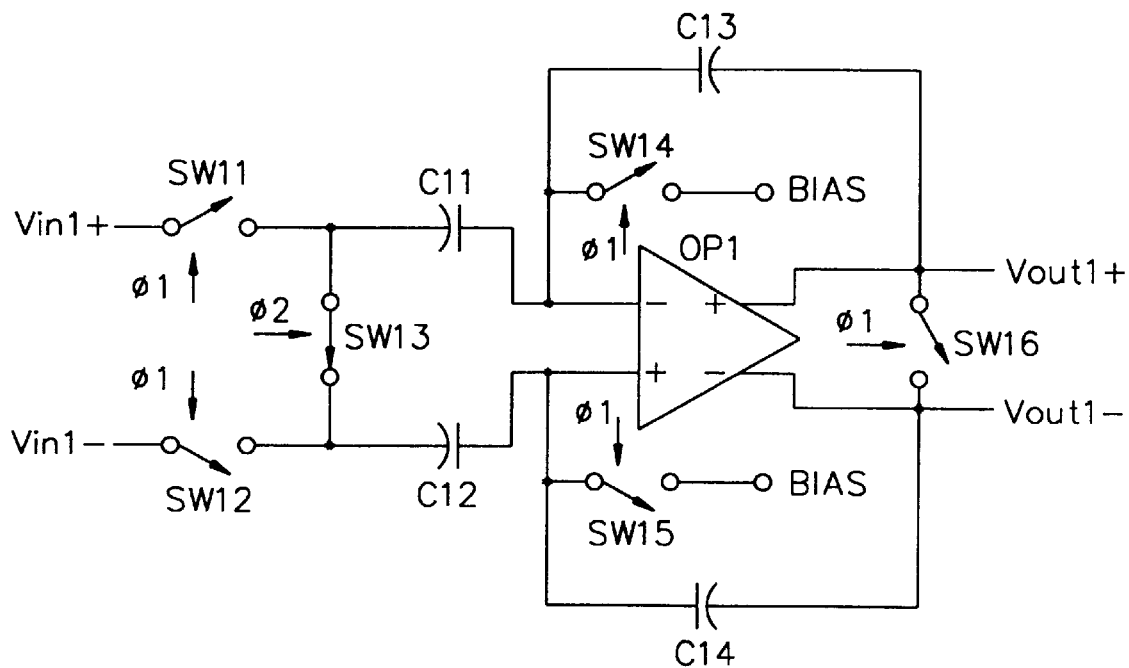
FIGS. 3 and 4 are circuit diagrams showing sample/hold amplifiers in FIG. 2.

An exemplary circuit for the first sample/hold amplifier 201 is shown in FIG. 3. Switches SW11, SW12 that receive input signals Vin1+, Vin1−, respectively, are coupled to input terminals (−), (+), respectively, of an operational amplifier OP1 through capacitors C11, C12. A switch SW13 is coupled between the switches SW11, SW12. A switch SW14 that receives a bias voltage BIAS is coupled to the inversion input terminal (−) of the operational amplifier OP1, and a capacitor C13 is coupled between the inversion input terminal (−) and a non-inversion output terminal Vout1+. A switch SWI5 that receives the bias voltage BIAS is coupled to the non-inversion input terminal (+) of the operational amplifier OPI, and a capacitor C14 is coupled between the non-inversion input terminal (+) and an inversion output terminal Vout1−. Also, a switch SW16 is coupled between the output terminals Vout1+, Vout1− of the operational amplifier OP1.

Figure 4:
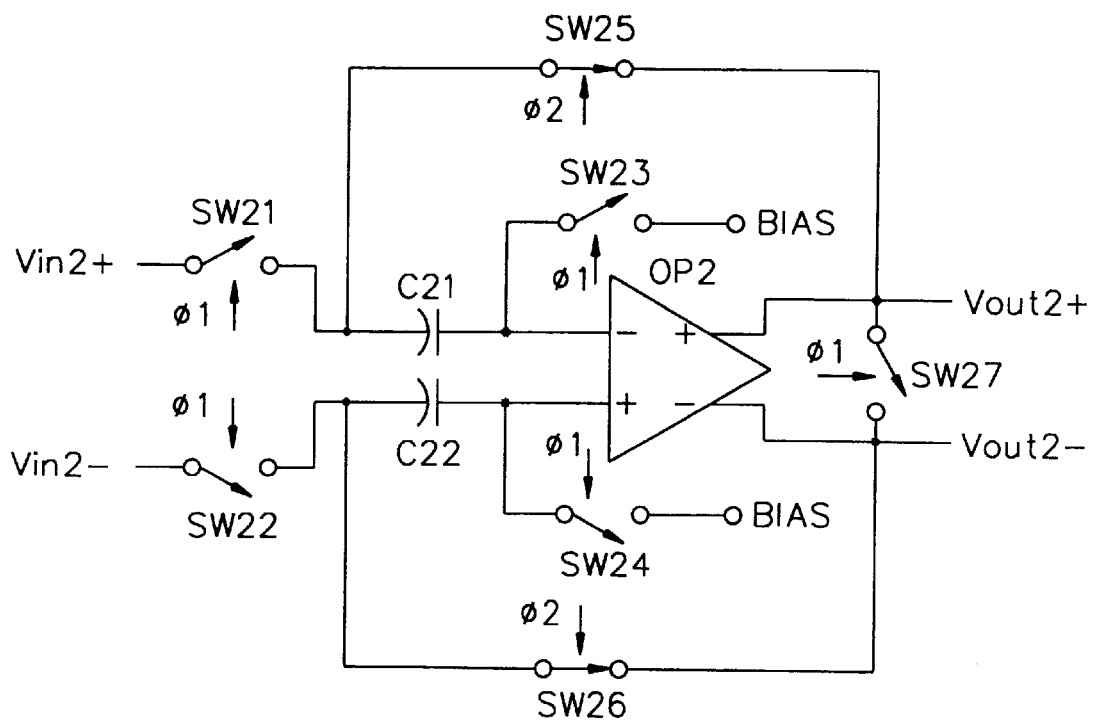

An exemplary circuit for the second sample/hold amplifier 205 is shown in FIG. 4. Switches SW21, SW22 that receive input signals Vin2+, Vin2−, respectively, are coupled to input terminals (−), (+), respectively, of an operational amplifier OP2 through capacitors C21, C22. The inversion input terminal (−) of the operational amplifier OP2 is coupled to a switch SW23 that receives a bias voltage BIAS, and the non-inversion input terminal (+) is coupled to a switch SW24 that receives the bias voltage BIAS. A switch SW25 is coupled between the switch SW21 and a non-inversion output terminal Vout2+ of the operational amplifier OP2, and a switch SW26 is coupled between the switch SW22 and an inversion output terminal Vout2−. A switch SW27 is coupled between the output terminals Vout2+, Vout2−. As shown in FIGS. 3–4, each of the capacitors C11 to C14, C21, and C22 is a metal-to-metal capacitor.

Figure 7:
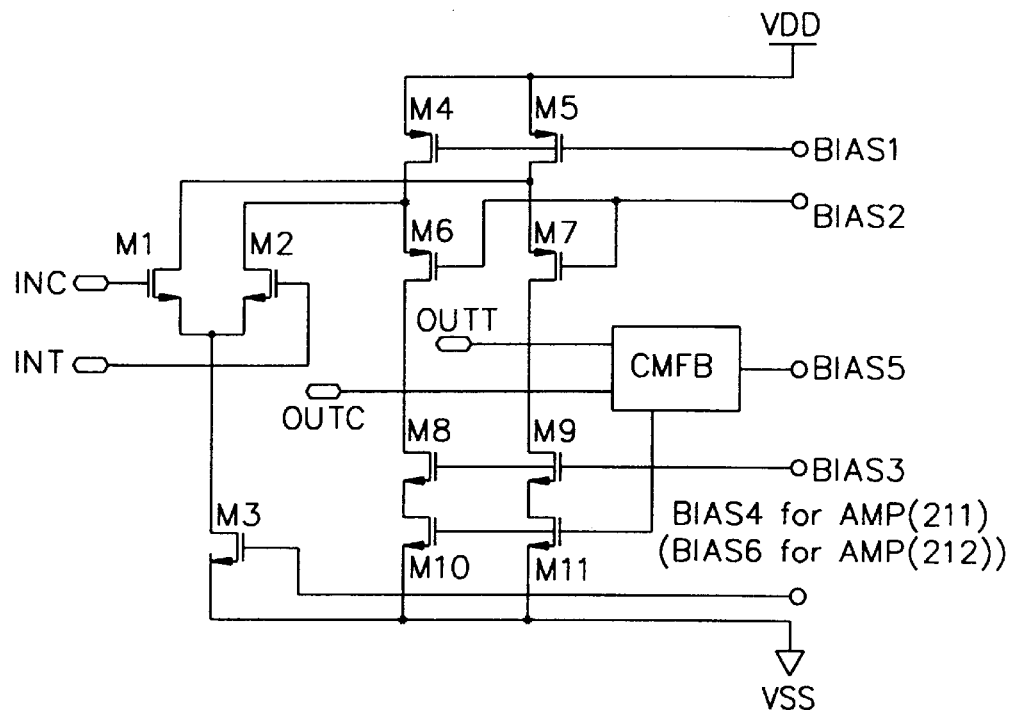
FIG. 7 is a circuit diagram showing an exemplary amplifier of FIGS. 3, 4, and 5.

Preferably, the operational amplifiers OP1, OP2 are respectively formed of a single circuit as shown in FIG. 7. Further, as shown in FIG. 5, the remain voltage amplifier 204 in an exemplary circuit for multiplying D/A converter (MDAC) includes a pair of amplifier circuits 211, 212 coupled in series.

Bias voltages BIAS1–BIAS6 are preferably applied to each of the operational amplifiers OP1, OP2. In addition, the operational amplifiers OP1, OP2 do not include a tuning circuit.

Figure 5:
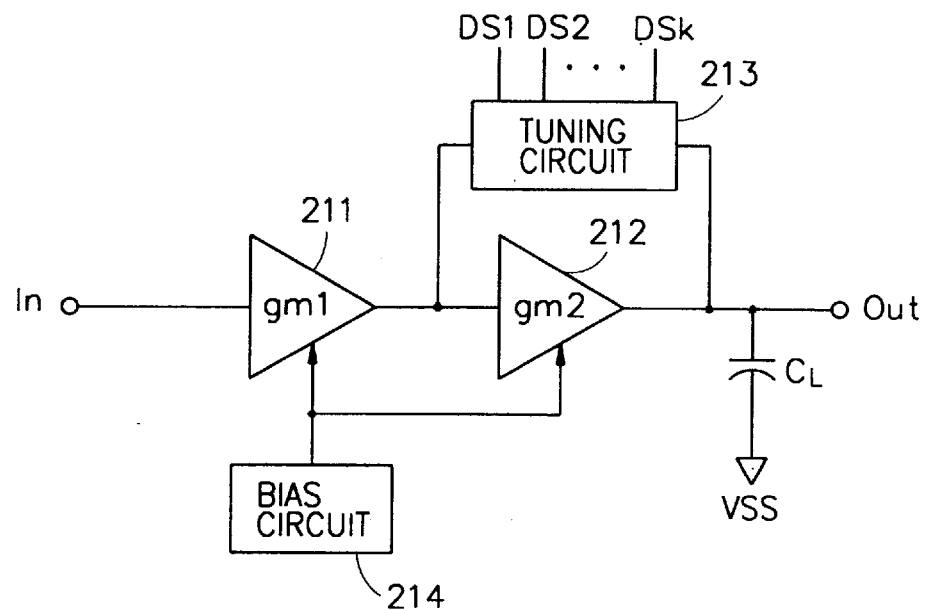
FIG. 5 is a circuit diagram showing an exemplary multiplying D/A converter (MDAC) of FIG. 2.

As shown in FIG. 5, each of the amplifiers 211, 212, provided in the remain voltage amplifier 204 in the MDAC is coupled to a tuning circuit 213 having a plurality of frequency compensation capacitors C1–Ck to stabilize the circuit. The tuning circuit 213 varies its capacitance using the capacities C1–Ck. The capacitors C1–Ck are metal-to-metal capacitors. When a certain capacitor is selected, the remaining capacitors C1–Ck couple top and bottom metal plates. In addition, preferably conductance gm2 of the amplifier 212 is always bigger than conductance gm1 of the amplifier 211.

An exemplary circuit for each of the amplifiers 211, 212 and the operational amplifiers OP1, OP2 is shown in FIG. 7.

As shown in FIG. 7, each of PMOS transistors M4, M5 has a source receiving a voltage Vdd and a gate receiving a bias voltage BIAS1. Drains of the PMOS transistors M4, M5 are coupled to drains of NMOS transistors M1, M2, respectively. The NMOS transistors M1, M2 each have a gate respectively receiving input signals INC, INT and drains respectively coupled to sources of the PMOS transistors M7, M6, which each have a gate receiving a bias voltage BIAS2. Each source of the NMOS transistors M1, M2 is coupled to a drain of a NMOS transistor M3, which has a gate for receiving a bias voltage BIAS4. NMOS transistors M10, M11 each have a gate that receives a signal outputted from an output common mode feedback circuit CMFB to which a bias voltage BIAS5 is applied. Drains of NMOS transistors M10, M11 are coupled to sources of NMOS transistors M8, M9, respectively. Each source of the NMOS transistors M3, M10 and M11 is grounded, and drains of the PMOS transistors M6, M7 are coupled to drains of the NMOS transistors M8, M9, respectively. Connection points of the PMOS transistors M6, M7 and the NMOS transistors M8, M9 are coupled to become output terminals OUTC, OUTT of the output common mode feedback circuit CMFB.

Figure 8:
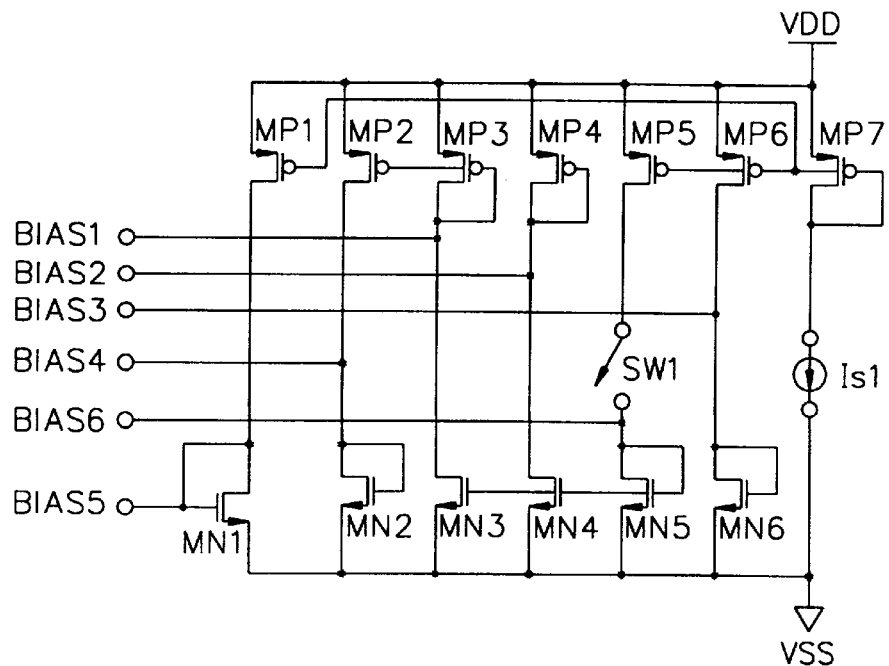
FIG. 8 is a diagram showing an exemplary bias circuit of FIG. 5.

In an exemplary bias circuit 214 as shown in FIG. 8, the voltage Vdd is applied to each source of first to seventh PMOS transistors MP1–MP7, and sources of first to sixth NMOS transistors MN1–MN6 are grounded. Drains of the MOS transistors MP1, MN1 are commonly coupled at a connection point that generates a bias voltage BIAS5. A gate of the NMOS transistor MN1 is also coupled to the bias voltage BIAS5. Drains of the MOS transistors MP2, MN2 are commonly coupled at a connection point that generates a bias voltage BIAS4, which is coupled to a gate of the NMOS transistor MN2. Drains of the MOS transistors MP3, MN3 are commonly coupled at a connection point that generates a bias voltage BIAS1. The bias voltage BIAS1 is coupled to each gate of the MOS transistors MP2, MP3. Drains of the MOS transistors MP4, MN4 are commonly coupled at a connection point that generates a bias voltage BIAS2, which is coupled to a gate of the PMOS transistor MP4. A switch SW1 coupled between a drain of the PMOS transistor MP5 and a drain of the NMOS transistor MN5 and coupled to each gate of the NMOS transistors MN3–MN5. The switch SW1 generates a bias voltage BIAS6. Drains of the MOS transistors MP6, MN6 are commonly coupled at a connection point that generates a bias voltage BIAS6, which is coupled to a gate of the NMOS transistor MN6. A drain of the PMOS transistor MP7 is coupled to a current source Isl at a connection point, which is coupled to gates of the PMOS transistors MP1, MP5, MP6, MP7.

Operations and effects of the preferred embodiment of the A/D converting circuit according to the present invention will now be described. First, when the switch 202 is coupled to a channel 1, the first sample/hold amplifier 201 samples/holds an analog input signal Vi, and a signal outputted from the first sample/hold amplifier 201 is inputted to the subtracter 203 and the A/D sub-converter 206.

The signal from the first sample/hold amplifier 201 is inputted to the remain voltage amplifier 204 via the subtracter 203. Then, a signal amplified at a predetermined level in the remain voltage amplifier 204 is inputted to the second sample/hold amplifier 205.

Also, the signal outputted from the first sample/hold amplifier 201 is converted to a digital signal in the A/D sub-converter 206 and inputted to the digital correcting unit 208. The digital signal from the A/D sub-converter 206 is converted to an analog signal in the D/A sub-converter 207 and inputted to the subtracter 203.

The switch 202 is switched to a channel 2, which couples an output terminal of the second sample/hold amplifier 205 to the subtracter 203 and the A/D sub-converter 206. Accordingly, the subtracter 203 subtracts an output signal from the D/A sub-converter 207 from an output signal from the second sample/hold amplifier 205, and outputs a difference value thereof to the remain voltage amplifier 204. The signal is again amplified at a predetermined level in the remain voltage amplifier 204 and inputted to the A/D sub-converter 206 and the subtracter 203 via the second sample/hold amplifier 205 and the switch 202.

The A/D sub-converter 206 converts the signal fed back through the switch 202 to a digital feedback signal, and outputs the digital feedback signal to the digital correcting unit 208. Also, the digital feedback signal is converted to an analog signal by the D/A sub-converter 207 and inputted to the subtracter 203.

Therefore, the subtracter 203 subtracts an output signal from the D/A sub-converter 207 from an output signal from the second sample/hold amplifier 205, and a difference value thereof is inputted to the remain voltage amplifier 204. The remain voltage amplifier 204 amplifies the signal (i.e., the difference value) outputted from the subtracter 203 at the predetermined level to output to the second sample/hold amplifier 205.

The A/D sub-converter 206 preferably outputs a signal of 1 bit to the digital correcting unit 208 with each cycle. Further, a digital signal of an n-th bit is output last. For example, when the A/D sub-converter 206 outputs a digital signal of 12 bits, the digital correcting unit 208 receives the digital signal of 12 bits after 11 cycles are accomplished.

To minimize or reduce the number of the metal-to-metal capacitors applied to the circuit according to the preferred embodiment of the present invention, the A/D sub-converter 206 outputs a digital signal of 1 bit by each cycle. Accordingly, the digital correcting unit 208 superimposes input data of n bits by 1 bit at a time, thus eliminating an offset or a feedthrough error existing in the first and second sample/hold amplifiers 201, 205, the A/D sub-converter 206 and the D/A sub-converter 207. The above-described operation is repeatedly performed until the digital correcting unit 208 outputs the N bit digital signal under control of the timing clock signal outputted from the timing circuit 209.

To improve the operational performance of the system according to the present invention, the preferred embodiment uses a couple of the sample/hold amplifiers 201, 205. As shown in FIG. 3, the first sample/hold amplifier 201 is provided with the four capacitors C11–C14 to reduce signal distortion. In addition, as shown in FIG. 4, since the second amplifier 205 performs a signal process for most of the cycles, the second sample/hold amplifier 205 is provided with the two capacitors C21, C22 to minimize power consumption.

The first sample/hold amplifier 201 is operated by pseudo clocks $\phi 1$, $\phi 2$ which are not superimposed, thus determining input efficiency of the analog/digital converting circuit system. The first sample/hold amplifier 201 samples an input signal while a phase of the pseudo clock $\phi 1$ is active, and outputs a differential amplified signal by coupling the two input terminals while a phase of the pseudo clock $\phi 2$ is active. The pseudo clock $\phi 1$ preferably has a same phase as a clock signal that is applied to the A/D sub-converter 206. The pseudo clock $\phi 2$ is preferably an inversion signal of the pseudo clock $\phi 1$.

The above-described method of operating the preferred embodiment of the A/D converting circuit is applied to reduce or minimize a change of an input common mode voltage of the operational amplifier OP1 provided in the first sample/hold amplifier 201 to reduce signal distortion. However, since feedback gain in the first sample/hold amplifier 201 is preferably increased twice as much as in the second sample/hold amplifier 205 having the two capacitors C21, C22 as shown in FIG. 4, the first sample/hold amplifier 201 requires twice the power as the second sample/hold amplifier 205 to obtain the same performance as the second sample/hold amplifier 205.

However, after sampling a first input signal, the first sample/hold amplifier 201 is not operated for the remaining cycles. Therefore, the power consumption of the first sample/hold amplifier may be ignored for those cycles.

In addition, the multiplying D/A converter (MDAC) is preferably constructed by integrating the switch 202, the subtracter 203, the remain voltage amplifier 204, and the D/A sub-converter 207 as a single circuit. Further, a capacitance applied to each circuit of the MDAC is preferably is a single poly layer, with the metal-to-metal capacitor formed of a pair of metals. In particular, since a double poly capacitor may not be applied to the preferred embodiment of the present invention, the capacitor, where two metal layers and a poly are provided, employs the two metals having the smallest parasitic capacitance value as a bottom-plate and a top-plate. In this case, an unit area capacitance value is so small that a large area is needed to integrate each unit in a single chip.

Therefore, the A/D sub-converter 206 preferably outputs a of 1 bit output signal for each cycle, which reduces or minimizes a required capacitance value for the system according to the preferred embodiment of the present invention.

Generally, when the metal-to-metal capacitor is employed, the capacitance value applied to an unit such as an operational amplifier may vary ±30% because of changes of the manufacturing process. Accordingly, in the worst case, the related art A/D converting circuits system can become inoperable. Such problems often occur in related art hybrid mode circuits.

Figure 6:
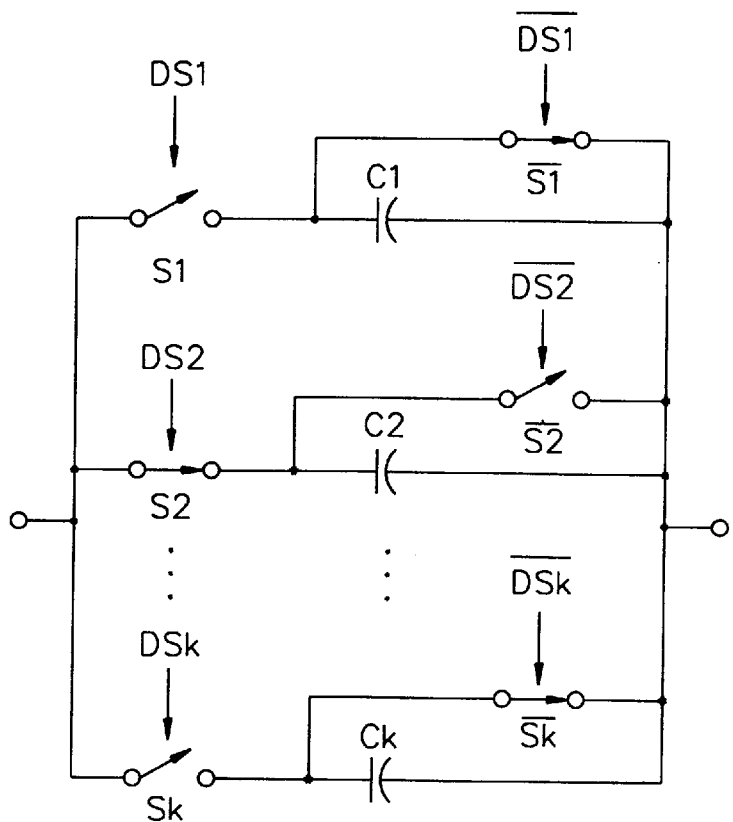
FIG. 6 is a circuit diagram showing an exemplary tuning circuit of FIG. 5.

When an accuracy of the supplied capacitance according to the preferred embodiment of the present invention varies considerably e.g., drops, the tuning circuit 213 as shown in FIG. 6 prevents the MDAC including the operational amplifier from being deteriorated. The tuning circuit 213 controls the switches S1–Sk by digital signals DS1–DSk, and selects one capacitor among a plurality of capacitors C1–Ck as a compensation capacitor of the operational amplifier. Thus, the tuning circuit 213 can control the operation of the MDAC. The rest of capacitors C1–Ck couple the top-plate and the bottom-plate and do not affect the MDAC operation.

In the related art, power supply is suspended for half a cycle of a clock signal, and the power is again supplied for the remaining half cycle to perform the amplifying operation. However, the operational amplifier may not have a stable signal with a predetermined accuracy within a predetermined time because of the cyclic turn-on/turn-off operations.

An analog circuit block according to the preferred embodiment preferably includes the MDAC, and the first and second sample/hold amplifiers 201, 205 and consumes a major portion of the power consumed in the entire circuit system. The bias circuit 214 as shown in FIG. 8 sequentially supplies the bias voltages BIAS1–BIAS6 in a prescribed order to the folded-cascode amplifiers 211, 212 shown in FIG. 7 to reduce the power consumption by half while maintaining the signal stability. Specifically, the bias circuit 214 shown in FIG. 8 supplies the bias voltages to the folded-cascode amplifiers as shown in FIG. 7 in the order of BIAS6-BIAS1(2)-BIAS4 during half a cycle of the clock in which the switch SW1 is turned on. Accordingly, the second conductance gm2 of the amplifier 212 is always greater than the first conductance gm1 of the amplifier 211. The second conductance gmn2 of the amplifier 212 as shown in FIG. 5 is always greater than the first conductance gm1 of the amplifier 212 to control the operational amplifier to provide sufficient phase margin and maintain satisfactory signal stability using pole splitting occurred between two frequencies, (e.g., a unit gain frequency $W_{unity}$ and a second pole $w_{p2}$.)

Further, in the two amplifiers 211, 212, the PMOS transistors are preferably twice as large as the NMOS transistors because electron mobility of the PMOS transistors is smaller than that of the NMOS transistors. Also, since the bias voltages BIAS3, BIAS5 in the bias circuit 214 as shown in FIG. 8 control a common mode voltage, they almost have no power consumption, thereby always being in an on-state.

As described above, the preferred embodiment of an A/D converting circuit according to the present invention has various advantages. The preferred embodiment of the A/D converting circuit can recuce(e.g., reduce by half the power consumption of the circuit blocks including the operational amplifier such as the MDAC, and the first and second sample/hold amplifiers. To solve the disadvantage that a large area is needed to have the metal-to-metal capacitor using two metal layers (e.g., small unit area capacitance) without changing the standard digital CMOS manufacturing process, the A/D converting circuit of the preferred embodiment includes the capacitor tuning circuit that generates a digital signal of 1 bit for each cycle and reduces a number of capacitors. Thus, an integrated circuit area is reduced or minimized, and the system is protected from instabilities caused by capacitance variation (e.g., change) of metal-to-metal capacitors.

The preferred embodiment of the A/D converting circuit further reduces or minimizes power consumption of an analog circuit block (area) to increase system performance. The A/D converting circuit according to the present invention can be applied to a system using the related art analog circuit or to the related art hybrid mode circuit in which analog and digital circuits coexist without any modification or change. Accordingly, the A/D converting circuit according to the preferred embodiment reduces manufacturing costs since no additional manufacturing process is required.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. An analog/digital (A/D) converting circuit, comprising:
   a first sample/hold amplifier that samples/holds an analog input signal;
   a switch that selects one of an analog output signal from the first sample/hold amplifier and an analog feedback signal;
   an A/D sub-converter that converts an analog output signal from the switch to a digital signal;
   a digital/analog (D/A) sub-converter that converts the digital signal from the A/D sub-converter to a converted analog signal;

a subtracter that generates a difference value between the analog output signal from the switch and the converted analog signal;

a voltage amplifier that amplifies the difference value from the subtracter;

a second sample/hold amplifier that samples/holds an output signal from the voltage amplifier and outputs the feedback signal to the switch; and a digital correcting unit coupled to the A/D sub-converter that outputs an N bit digital signal in a plurality of cycles.

2. The circuit of claim 1, further comprising a timing controller that generates a control signal and a timing clock signal for each unit of the A/D converting circuit.

3. The circuit of claim 1, wherein the switch selects the analog output signal from the first sample/hold amplifier in a first cycle of the plurality of cycles and the analog feedback signal in the remaining plurality of cycles.

4. The circuit of claim 1, wherein the first sample/hold amplifier has greater feedback gain than the second sample/hold amplifier.

5. The circuit of claim 1, wherein the A/D sub-converter generates an output signal of 1 bit in each of the plurality of cycles, wherein the digital correcting unit outputs the N bit digital signal in the plurality of cycles by superimposing output signals from the A/D subconverter by 1 bit at a cycle.

6. The circuit of claim 1, wherein the switch, the D/A sub-converter, the subtracter, and the voltage amplifier are integrated as a single circuit.

7. The circuit of claim 1, wherein in the first sample/hold amplifier comprises:

an operational amplifier;

first and second capacitors respectively coupled to inversion and non-inversion input terminals of the operational amplifier;

first and second switches respectfully coupled to the first and second capacitors, wherein the first and second switches receive corresponding input signals;

a third switch coupled between the first and second switches;

a fourth switch that receives a bias voltage coupled to the inversion input terminal of the operational amplifier;

a third capacitor coupled between the inversion input terminal and a non-inversion output terminal of the operational amplifier;

a fifth switch that receives the bias voltage coupled to the non-inversion input terminal of the operational amplifier;

a fourth capacitor coupled between the non-inversion input terminal and an inversion output terminal of the operational amplifier; and a sixth switch is coupled between the inversion and non-inversion output terminals of the operational amplifier.

8. The circuit of claim 7, wherein each of the first to fourth capacitors is a metal-to-metal capacitor, and wherein the first to sixth switches are operated by corresponding clock signals, wherein in each of the corresponding signals has a different phase that is not superimposed with each other.

9. The circuit of claim 1, wherein each of the amplifiers comprises an operational amplifier, the operational amplifier comprising:

first and second transistors having respective first electrodes that receive a first prescribed voltage and control electrodes that receive a first bias voltage;

third and fourth transistors having control electrodes that respectively receive first and second input signals;

fifth and sixth transistors having control electrodes that respectively receive a second bias voltage and respective first electrodes coupled to corresponding second electrodes of the first through fourth transistors;

a seventh transistor having a control electrode that receives a fourth bias voltage and a second electrode coupled to the first electrodes of the third and fourth transistors;

eighth and ninth transistors having control electrodes coupled to a third bias voltage and having second electrodes respectively coupled to second electrodes of the fifth and sixth transistors; and tenth and eleventh transistors having control electrodes that receives a signal outputted from an output common mode feedback circuit to which a fifth bias voltage is applied, having second electrodes respectively coupled to first electrodes of the eighth and ninth transistors, wherein each first electrode of the third, tenth, and eleventh transistors is coupled to a second prescribed voltage, and wherein connection points between the fifth and eighth and the sixth and ninth transistors, respectively, are first and second output terminals.

10. The circuit of claim 1, further comprising a bias circuit that applies a bias voltage to an operational amplifier, the bias circuit comprising:

first to seventh transistors having first electrodes that receive a first prescribed voltage;

eighth to thirteenth transistors having first electrodes that are grounded, wherein second and control electrodes of the third, fourth, seventh, eighth, ninth, twelfth and thirteenth transistors are connected together, wherein second electrodes of the first and eighth transistors are commonly connected, wherein second electrodes of the second and ninth transistors are commonly connected, wherein second electrodes of the third and tenth transistors are commonly connected, wherein second electrodes of the fourth and tenth transistors are commonly connected; and a switch connected between second electrodes of the fifth and twelfth transistors, wherein second electrodes of the sixth and thirteenth transistors are commonly connected, and a second electrode of the seventh transistor is connected to a current source and control electrodes of the first, fifth, sixth and seventh transistors, wherein control electrodes of the tenth, eleventh and twelfth transistors are coupled together, and the second electrodes of the first to sixth transistors respectively output six bias voltages.

11. The circuit of claim 1, wherein the second sample/hold amplifier comprises:

an operational amplifier;

first and second capacitors coupled to inversion and non-inversion input terminals, respectively, of the operational amplifier;

first and second switches respectively coupled to the first and second capacitors to receive corresponding input signals;

a third switch that receives a bias voltage coupled to the inversion input terminal of the operational amplifier;

a fourth switch that receives the bias voltage coupled to the non-inversion input terminal of the operational amplifier;

a fifth switch coupled between the first switch and a non-inversion output terminal of the operational amplifier;

a sixth switch coupled between the second switch and an inversion output terminal of the operational amplifier; and a seventh switch coupled between the inversion and non-inversion output terminals of the operational amplifier.

12. The circuit of claim 11, wherein each of the first and second capacitors is a metal-to-metal capacitor, and wherein the first to seventh switches are operated by clock signals having a different phases that are mutually exclusive.

13. A circuit for converting a first type input signal to a second type output signal, comprising:

a first amplifier that receives the first type input signal;

a switch that selects one of an output signal from the first amplifier and a feedback signal;

a sub-converter that converts an output signal from the switch to a signal of a second type;

a converting block that converts the output signal from the sub-converter to a first signal of the first type and amplifies a difference in value between the first signal and one of the first type input signal and the feedback signal;

a second amplifier that receives an output signal from the converting block and outputs the feedback signal to the switch; and a correcting unit coupled to the sub-converter that outputs the second type output signal.

14. The circuit of claim 13, further comprising a timing controller for generating a control signal and a timing clock signal for operations of each of the first and second amplifiers, the switch, the sub-converter, the converting block and the correcting unit, wherein the correcting unit superimposes output signals from the sub-converter to output the second type output signal of N bits.

15. The circuit of claim 13, wherein the converting block comprises:

first and second amplifiers coupled in series between an input node and an output node;

a bias circuit coupled to the first and second amplifiers; and a tuning circuit coupled to an input terminal and an output terminal of the second amplifier.

16. The circuit of claim 15, wherein each of the capacitors is a metal-to-metal capacitor, and wherein when a capacitor among the capacitors is selected, the remaining capacitors connect top and bottom-plates.

17. The circuit of claim 15, wherein the tuning circuit comprises:

a pair of series switch units connected in parallel; and a plurality of capacitors, wherein a first of the pair of series switch unit is connected in parallel with corresponding ones of the plurality of capacitors, and wherein the pair of series switch units are respectively controlled by each of a plurality of digital input signals.

18. The circuit of claim 17, wherein conductance of the second amplifier is always greater than that of the first amplifier, and wherein the switch is installed in the multiplying D/A converting block.

* * * * *